(12) United States Patent
Kozawa et al.

(10) Patent No.: US 7,144,968 B2
(45) Date of Patent: Dec. 5, 2006

(54) SILICON-CONTAINING POLYMER, PROCESS FOR ITS PRODUCTION, RESIST COMPOSITION EMPLOYING IT, PATTERN-FORMING METHOD AND ELECTRONIC DEVICE FABRICATION METHOD

(75) Inventors: Miwa Kozawa, Kawasaki (JP); Keiji Watanabe, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 188 days.

(21) Appl. No.: 10/005,347

(22) Filed: Dec. 7, 2001

(65) Prior Publication Data

US 2002/0120058 A1 Aug. 29, 2002

Related U.S. Application Data

(62) Division of application No. 09/553,479, filed on Apr. 20, 2000, now Pat. No. 6,342,562.

(30) Foreign Application Priority Data

Apr. 23, 1999 (JP) .......................................... 11-116517
Mar. 23, 2000 (JP) ......................................... 2000-82613

(51) Int. Cl.
C08G 77/04 (2006.01)

(52) U.S. Cl. ....................... 528/39; 556/458; 556/460; 528/23; 528/12; 528/41; 430/325; 524/588; 427/387

(58) Field of Classification Search ................ 556/458, 556/460; 528/39, 41, 23, 12; 430/325; 524/588; 427/387

See application file for complete search history.

(56) References Cited

U.S. PATENT DOCUMENTS 2,721,856 A  10/1955  Sommer
2,833,802 A   5/1958  Merker et al.
3,471,435 A  10/1969  Miller
4,418,165 A * 11/1983  Polmanteer et al.
4,725,658 A *  2/1988  Thayer et al.
5,708,098 A *  1/1998  Cook et al. .................. 525/477

FOREIGN PATENT DOCUMENTS

| JP | 58-96654   | 6/1983  |
| JP | 61-108628  | 5/1986  |
| JP | 62-104032  | 5/1987  |
| JP | 62-220949  | 9/1987  |
| JP | 1-56732    | 3/1989  |
| JP | 1-22224    | 9/1989  |
| JP | 3-29311    | 2/1991  |
| JP | 5-58446    | 3/1993  |
| JP | 5-181280   | 7/1993  |
| JP | 6-95385    | 4/1994  |
| JP | 6-184311   | 7/1994  |
| JP | 6-202338   | 7/1994  |
| JP | 08-325276  | 10/1996 |
| JP | 11-130860  | 5/1999  |

OTHER PUBLICATIONS

Chemical Abstract 1950, 46:10681g.
Hochmolekularbericht 1971, H. 1408/71.
Hockmolekularbericht 1981, H. 12827/81.
Derment CPI, 1987, Ref. 87–95374/14.
Chemical Abstract 1950, 46:10681g.
Hochmolekularbericht 1971, H. 1408/71.
Hochmolekularbericht 1981, H.12821/81.
Derment CPI, 1987, Ref. 87–95374/14.

* cited by examiner

*Primary Examiner*—Kuo-Liang Peng
(74) *Attorney, Agent, or Firm*—Arent Fox PLLC

(57) ABSTRACT

A silicon-containing polymer having a tetrafunctional siloxane portion as the basic skeleton, and containing a carboxylic acid group-containing triorganosiloxane portion and a carboxylic acid derivative group-containing triorganosiloxane portion in a specific proportion. It may be advantageously used as a negative non-chemical amplification resist polymer or a positive chemical amplification resist polymer.

10 Claims, 1 Drawing Sheet

SILICON-CONTAINING POLYMER, PROCESS FOR ITS PRODUCTION, RESIST COMPOSITION EMPLOYING IT, PATTERN-FORMING METHOD AND ELECTRONIC DEVICE FABRICATION METHOD

This is a Division of application Ser. No. 09/553,479 filed Apr. 20, 2000 now U.S. Pat. No. 6,342,562. The disclosure of the prior application is hereby incorporated by reference herein in its entirety.

CROSS-REFERENCE TO RELATED APPLICATIONS

This application is based upon and claims priority of Japanese Patent Applications No. Hei 11-116517, filed Apr. 23, 1999, and No. 2000-82613, filed Mar. 23, 2000, the contents being incorporated herein by reference.

BACKGROUND OF THE INVENTION

1. Field of the Invention

The present invention relates to a silicon-containing polymer and a process for its production. In particular, the invention relates to a silicon-containing polymer that is useful as a primary agent in a resist material composition that provides intricate resist patterns by exposure to radiation with ArF excimer laser light, an electron beam or the like followed by development with an alkali developing solution, and to a process for its production. The invention further relates to a resist composition containing such a polymer, to a method of forming resist patterns using it, and to a method of fabricating electronic devices including LSIs, magnetic heads, liquid crystal devices, MCMs, etc. and photomasks using the method.

2. Description of the Related Art

With the trend toward higher integration and higher functionality of electronic devices, such as semiconductor devices, in recent years, progress continues to be made toward more intricate and multilayered wirings. In the manufacture of second generation semiconductor devices with ever higher integration and higher functionality, research has begun on using ArF excimer lasers and EUV light as exposure light sources in lithography techniques for intricate working, and progress is being made toward shorter wavelength applications. Problems raised with shorter wavelength light sources include the transmittance of the resist materials and reflection from the substrates, but surface imaging has been proposed as an effective technique to counter these problems, and a particularly effective method is the bi-layer resist method employing silicon-containing polymers as resist materials.

According to the bi-layer resist method, an organic resin is coated to a film thickness of 1 μm, for example, to form a lower resist layer on which there is formed an upper resist layer of a thin film of about 0.1–0.2 μm, and then the upper resist layer is first patterned by light exposure and development of the upper layer and the resulting upper layer pattern is used as a mask for etching of the lower layer, to form a resist pattern with a high aspect ratio. The bi-layer resist method can alleviate or prevent the influence of level differences in the substrate and reflection from the substrate surface by the lower layer resist, while the small film thickness of the upper layer resist allows improved resolution compared to single-layer resist methods. Consequently, the bi-layer resist method is more advantageous than the single-layer resist method for formation of intricate patterns on substrates with large level differences and it is therefore believed to be a more effective resist process for the shorter wavelengths of exposure light sources which will be used in the future.

Bi-layer resist materials employing various silicon-containing polymers have been reported to date (for example, Japanese Unexamined Patent Publications SHO No. 58-96654, No. 61-108628, No. 62-104032 and No. 62-220949, Japanese Unexamined Patent Publications HEI No. 1-56732, No. 1-222254, No. 3-29311, No. 5-58446, No. 5-181280, No. 6-95385, No. 6-184311, No. 6-202338 and No. 11-130860), but none of those available have been excellent for alkali development in terms of shelf-life, sensitivity, resolution, $O_2$-RIE resistance, heat resistance, or shorter wavelengths of exposure light sources for pattern intricacy. In particular, none have exhibited excellent developing properties in a 2.38% tetramethylammonium hydroxide (TMAH) aqueous solution, which is currently a commonly used alkali developing solution for mass production of LSIs, and this has been a drawback against their application to general purpose developing equipment.

BRIEF SUMMARY OF THE INVENTION

It is an object of the present invention to overcome the drawbacks of the prior art described above by providing a silicon-containing polymer whose production is simple, which exhibits an excellent shelf-life, which is suitable as a resist material that can be easily developed with common alkali developing solutions, and which simultaneously provides high sensitivity, high resolution, high $O_2$-RIE resistance and high heat resistance.

It is another object of the invention to provide a silicon-containing polymer, a process for its production, a negative non-chemical amplification resist composition or chemical amplification resist composition containing it, a resist pattern-forming method employing the composition, and a fabrication method for electronic devices and photomasks that employs the method.

As a result of much diligent research aimed at achieving the aforementioned object, the present inventors have found that the problems described above can be solved by using a silicon-containing polymer with a specific proportion of functional groups.

Thus, the present invention provides a silicon-containing polymer including the structure represented by formula 1 below as a main structural unit.

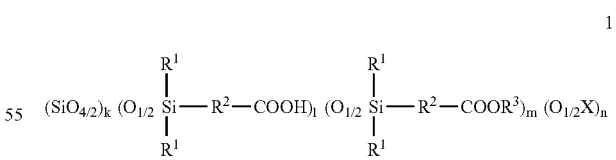

1 where $R^1$ represents a monovalent organic group, $R^2$ represents a direct bond or a divalent organic group, $R^3$ represents a monovalent organic group or an organosilyl group, any of which groups may be of different types, X represents hydrogen, a monovalent organic group or an organosilyl group, which groups may be of different types, k and l are positive integers, m and n are 0 or positive integers, and these subscripts satisfy the following relationship.

$$0 < \frac{l}{l+m+n} \leq 0.8 \qquad 0 \leq \frac{m}{l+m} < 0.2$$

That is, in formula 1, the ratio of the carboxylic acid group-containing triorganosiloxane portion and the carboxylic acid derivative group-containing triorganosiloxane portion is restricted, as represented by l and m. When a silicon-containing polymer according to the invention having the structure of formula 1 as the main structural unit is used as a negative non-chemical amplification resist, the carboxylic acid group-containing triorganosiloxane portion confers alkali solubility, thus affecting the solubility and resolution in alkali developing solutions, and consequently it must be present in a prescribed amount. Similarly, since the carboxylic acid derivative group-containing triorganosiloxane portion has an adverse effect of lowering the alkali solubility and resist resolution, its content is also restricted. For this reason, the carboxylic acid group-containing triorganosiloxane portion and the carboxylic acid derivative group-containing triorganosiloxane portion are present in a specific proportion represented by the relational equality given above.

The invention also provides a resist composition containing a silicon-containing polymer of the invention having the structure of formula 1 as the main structural unit. The resist composition is primarily a negative non-chemical amplification resist composition. The resist composition may contain one or more different silicon-containing polymers of the invention having the structure of formula 1 as the main structural unit, and if necessary it may also contain other desired polymers or compounds.

The invention also provides a silicon-containing polymer including the structure represented by formula 3 below as a main structural unit.

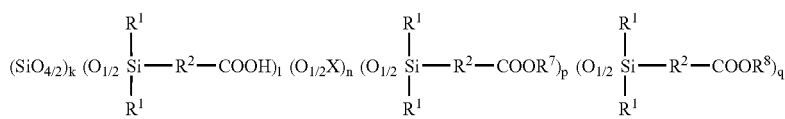

where $R^1$ represents a monovalent organic group, $R^2$ represents a direct bond or a divalent organic group, $R^7$ and $R^8$ each independently represent a monovalent organic group or an organosilyl group, any of which groups may be of different types, X represents hydrogen, a monovalent organic group or an organosilyl group, which groups may be of different types, k and q are positive integers, l, n and p are 0 or positive integers, and these subscripts satisfy the following relationship.

$$0 \leq \frac{l}{l+n+p+q} < 0.5 \qquad 0.1 < \frac{q}{l+n+p+q} \leq 0.8$$

That is, in formula 3, the ratio of the carboxylic acid group-containing triorganosiloxane portion and the carboxylic acid derivative group-containing triorganosiloxane portions is restricted, as represented by l, p and q. When a silicon-containing polymer according to the invention having the structure of formula 3 as the main structural unit is used as a positive chemical amplification resist, the carboxylic acid group-containing triorganosiloxane portion exhibits alkali solubility such that the non-exposed sections dissolve during development, and therefore its content is restricted.

Similarly, the carboxylic acid derivative group-containing triorganosiloxane portion (q) has a functional group that is eliminated by acid catalysts or when necessary heating, and this elimination reaction occurring at the exposed sections gives a resist pattern. Since the carboxylic acid derivative group-containing triorganosiloxane portion (p) that does not undergo elimination by the action of acid or the like has an adverse effect of lowering the alkali solubility and resist resolution, its content is also restricted. For this reason, the carboxylic acid group-containing triorganosiloxane portion and the two different carboxylic acid derivative group-containing triorganosiloxane portions are present in a specific proportion represented by the relational equality given above.

The invention also provides a resist composition containing a silicon-containing polymer of the invention having the structure of formula 3 as the main structural unit. The resist composition may contain one or more different silicon-containing polymers of the invention having the structure of formula 3 as the main structural unit, and if necessary it may contain an acid generator or if necessary it may also contain other desired polymers or compounds.

The resist composition of the invention may be used either in a single-layer resist method or in a bi-layer resist method.

One resist pattern-forming method according to the invention comprises using a resist composition of the invention to form a resist layer on a working substrate, and forming a resist pattern by light exposure and development of the resist layer.

Another resist pattern-forming method according to the invention is a method of using a first resist material to form a lower resist layer on a working substrate, using a second resist material to form an upper resist layer thereover, patterning the upper resist layer by light exposure and development, and etching the lower resist layer using the resulting upper layer pattern as a mask to form a resist pattern, and it comprises the use of a resist composition according to the invention described above as the second resist material.

DETAILED DESCRIPTION OF THE INVENTION

Figure 1:
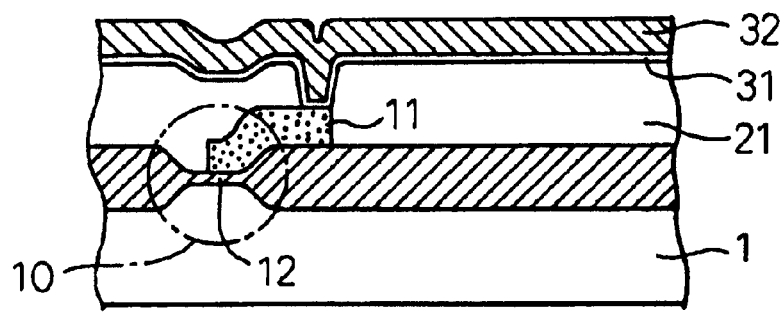
FIG. 1, FIG. 2 and FIG. 3 are illustrations of a method of forming a gate wiring pattern using a resist composition according to the invention.

The silicon-containing polymer of the invention is particularly useful as a base resin for a resist composition, and it includes a tetrafunctional siloxane portion as the skeleton and a triorganosiloxane portion having a carboxylic acid group as an alkali-soluble group. It may also include, in addition to these, other functional groups affecting the polymer properties, on which there are no particular restrictions so long as they are monovalent or divalent organic groups.

However, in general formula 1, k and l are positive integers, m and n are 0 or positive integers, and these subscripts satisfy the following relationship.

$$0 < \frac{l}{l+m+n} \leq 0.8 \qquad 0 \leq \frac{m}{l+m} < 0.2$$

That is, the ratio of the carboxylic acid group-containing triorganosiloxane portion and the carboxylic acid derivative group-containing triorganosiloxane portion is restricted.

In formula 1, the compositional ratio of the carboxylic acid group-containing triorganosiloxane portion (l) with respect to all of the terminal functional group units (l, m, n) other than the tetrafunctional siloxane skeleton (k) must be larger than 0, and no greater than 0.8. If this ratio is 0 the alkali solubility of the polymer is lost, so that it will not function as a negative non-chemical amplification resist. If it is greater than 0.8, the alkali solubility will be too high, making it difficult to obtain a pattern by development with the 2.38% TMAH aqueous solution used for ordinary intricate working. The compositional ratio of the carboxylic acid derivative group-containing triorganosiloxane portion (m) of the carboxylic acid group-containing triorganosiloxane portion and carboxylic acid derivative group-containing triorganosiloxane portion (l, m) must be 0 or greater and smaller than 0.2. The carboxylic acid derivative group-containing triorganosiloxane portion (m) is a cause of reduced resist performance in terms of alkali solubility and resist resolution, and it is preferably absent for use as a negative non-chemical amplification resist, while the upper limit of 0.2 can ensure resist performance. According to the invention, it was found that for inhibited production of the carboxylic acid derivative group-containing triorganosiloxane portion (m), it is effective to use tetraethoxysilane as the starting monomer for formation of the polymer skeleton during production of the silicon-containing polymer of the invention, and to use a carboxyl group-containing compound that does not react with the starting silicone monomer or the resulting silicon-containing polymer during production of the polymer. A low molecular weight carboxyl group-containing compound is preferred as the carboxyl group-containing compound, and acetic acid, acetic anhydride and the like are particularly preferred for use.

In formula 3, k and q are positive integers, l, n and p are 0 or positive integers, and these subscripts satisfy the following relationship.

$$0 \leq \frac{l}{l+n+p+q} < 0.5 \qquad 0.1 < \frac{q}{l+n+p+q} \leq 0.8$$

That is, the ratio of the carboxylic acid group-containing triorganosiloxane portion and the carboxylic acid derivative group-containing triorganosiloxane portion is restricted.

In formula 3, the compositional ratio of the carboxylic acid group-containing triorganosiloxane portion (l) with respect to all of the terminal functional group units (l, n, p, q) other than the tetrafunctional siloxane skeleton (k) must be 0 or greater, and smaller than 0.5. If this ratio is 0.5 or greater the alkali solubility of the polymer is increased, resulting in dissolution of the non-exposed sections. The compositional ratio of one carboxylic acid derivative group-containing triorganosiloxane portion (q) with respect to the terminal functional group units (l, n, p, q) must be greater than 0 and no greater than 0.8. Elimination of the ester portion of the carboxylic acid ester group by an acid catalyst or the like produces a carboxylic acid group and confers alkali solubility, thus allowing formation of a resist pattern, and therefore the compositional ratio is a factor governing the resist resolution. As concerns the other carboxylic acid derivative group-containing triorganosiloxane portion (p), p is preferably 0, but the value of p is not particularly restricted.

In formula 1 and formula 3, each $R^1$ is not particularly restricted so long as it is a monovalent organic group. A typical monovalent organic group is alkyl, and independent alkyl groups of 1–3 carbon atoms are particularly preferred. Where $R^2$ is a direct bond, it is meant that the symbol $R^2$ does not exist in the formulas. Where $R^2$ is a divalent organic group, it is not particularly restricted, and linear alkylene groups or cyclic alkylene groups of 1–10 carbon atoms, or combinations of such linear alkylene groups and cyclic alkylene groups, are preferred, among which linear alkylene groups of 1–10 carbons are more preferred, and linear alkylene groups of 1–3 carbon atoms are particularly preferred. Each $R^2$ may also be a different type of organic group mentioned above. $R^3$ and $R^7$ are not particularly restricted so long as they are monovalent organic groups or organosilyl groups, and they are preferably of different types. Preferred as monovalent organic groups are alkyl groups of 1–3 carbon atoms, and preferred as organosilyl groups are triorganosilyl groups having alkyl groups of 1–3 carbon atoms. $R^8$ is a monovalent organic group or organosilyl group, and is preferably a functional group that is eliminated by acid generated by a photo-acid generator upon light exposure. As examples of such functional groups there may be mentioned triorganosilyl groups, t-butyl, tetrahydropyranyl and 2-alkyladamantyl groups. Selection of these functional groups will be determined based on the properties desired for the resist composition that includes the silicon-containing polymer of the invention, and multiple different types may also be present depending on the need.

X represents hydrogen, a monovalent organic group or an organosilyl group, none of which are restricted, and they may be of different types. Typical preferred monovalent organic groups include alkyl groups of 1–10 carbon atoms and their substituted forms. Preferred as organosilyl groups are triorganosilyl groups including alkyl groups of 1–10 carbon atoms, alkenyl groups of 2–10 carbon atoms, aryl groups, haloalkyl groups or haloaryl groups. At least some of the X groups are preferably triorganosilyl groups.

The silicon-containing polymer with the structure of formula 1 preferably includes a triorganosilyl group with a photosensitive crosslinkable group in at least some of the X groups, and particularly preferred are polymers represented by formula 2 below wherein at least some of the X groups include a chloromethylphenylethyl-containing triorganosilyl group as a photosensitive crosslinkable group

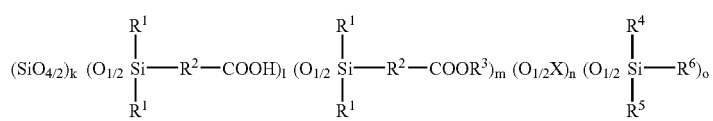

where $R^1$ represents a monovalent organic group, $R^2$ represents a direct bond or a divalent organic group, $R^3$ represents a monovalent organic group or an organosilyl group, any of which groups may be of different types, X represents hydrogen, a monovalent organic group or an organosilyl group, which groups may be of different types, $R^4$, $R^5$ and $R^6$ each independently represent a monovalent organic group, at least one of which is a monovalent organic group including chloromethylphenylethyl, $R^4$, $R^5$ and $R^6$ may be one or more different types of organic groups, k, l and o are positive integers, m and n are 0 or positive integers, and these subscripts satisfy the following relationship.

$$0 < \frac{o}{l+m+n+o} \leq 0.8$$

The silicon-containing polymer of the invention may also have any desired silicon-containing polymer skeleton other than a tetrafunctional siloxane structure as represented by formulas 1–3, for example, a skeleton with a trifunctional siloxane structure, difunctional siloxane structure, silsesquioxane structure or polysilane structure, and it may also have a skeleton with a tetrafunctional siloxane structure as represented by formulas 1–3, as well as any desired two or more different silicon-containing polymer skeletons.

The weight average molecular weight of the silicon-containing polymer of the invention is preferably in the molecular weight range of 1500 to 1,000,000, and more preferably 3000–20,000, in terms of polystyrene. If the molecular weight is lower than this range the heat resistance of the resist material is reduced, while if the molecular weight is above this range it will sometimes be unusable as a resist.

If necessary, a photo-acid generator or other compounds may be added to the resist composition of the invention that contains as the main component a silicon-containing polymer of the invention. As examples of useful photo-acid generators there may be mentioned onium salts such as diphenyliodonium salts and triphenylsulfonium salts, sulfonic acid esters such as benzyl tosylate and benzyl sulfonate, and halogen-containing organic compounds such as dibromobisphenol A and tris-dibromopropyl isocyanurate, but there is no restriction to these. The amount of photo-acid generator added is preferably 0.1–20 parts by weight to 100 parts by weight of the silicon-containing polymer, as a smaller amount may prevent practical photo-sensitivity and a larger amount may reduce the film quality or resolution. As other compounds to be added, there may be mentioned surface active agents for improving the film formability, crosslinking agents for accelerating the crosslinking of the silicon-containing polymers of formula 1 and formula 2, solubility-inhibiting agents for solubility contrast of the silicon-containing polymer of formula 3 and amine-based compounds for improving the stability of the film.

The resist composition of the present invention that contains, as the main component, a silicon-containing polymer of the invention having the structure of formula 3 as the main structural unit becomes alkali soluble when the functional group of $R^8$ in the silicon-containing polymer is eliminated by an acid catalyst generated by the photo-acid generator upon light exposure; however, the elimination of the functional group may be accelerated by heating after the light exposure.

When forming a resist pattern using the resist composition of the invention, a resist layer may be formed directly on a working substrate using the resist composition of the invention, and the resist layer subsequently patterned by light exposure or development, to form the desired resist pattern (single-layer resist method). Alternatively, a first resist layer (lower layer resist) may be formed on a working substrate, followed by formation of an upper resist layer using the resist composition of the invention, followed by patterning of the upper resist layer by light exposure and development, and etching of the lower resist layer using the resulting upper pattern as a mask, to thereby form a resist pattern with a high aspect ratio, consisting of the upper pattern and the lower pattern (bi-layer resist method). The working substrate used may be any substrate on which it is desired to form an intricate pattern using a photolithography method for manufacture of an electronic device such as a semiconductor device, but the working substrate is not limited to these.

The solvent used to form the resist composition of the invention may be an organic solvent such as propyleneglycol monomethylether acetate, n-butyl ether or methyl isobutyl ketone. The method of coating the resist composition of the invention onto the working substrate may be the same method as used for coating of ordinary resist materials, and spin coating may be employed. The coating film thickness of the resist composition is preferably 0.01–1.0 μm, since a smaller thickness will result in drastic dimensional variation during etching, and a larger thickness will lower the resolution. The film thickness is more preferably 0.05–0.2 μm.

The material for the lower layer resist in the case of a bi-layer resist method may be an organic material, and it is preferred to use a novolac resin-based or vinylphenol resin-based commercially available resist material, or a polyaniline-based or polythiophene-based conductive material. The lower resist layer is generally formed to a film thickness of 0.1–10.0 μm, and more preferably has film thickness of 0.2–2.0 μm.

The light source used for exposure of the resist material of the invention is preferably ultraviolet rays, a KrF excimer laser, an ArF excimer laser, vacuum ultraviolet rays (VUV), extreme ultraviolet rays (EUV), X-rays, an electron beam, an ion beam or the like.

The alkali developing solution used for development of the resist material of the invention may be a tetramethylammonium hydroxide (TMAH) aqueous solution, a potassium hydroxide aqueous solution, or the like. To either or both the developing solution and the rinsing solution of water there may be added alcohol or a surfactant to prevent pattern destruction or peeling.

According to the invention, a resist pattern may be easily formed by this method. By using this resist pattern-forming method, it is possible to fabricate LSIs, magnetic heads, liquid crystal devices, MCMs and other electronic devices, as well as photomasks.

Because the resist composition of the invention has the property of withstanding plasma etching by oxygen-containing gas, the resist composition of the invention may be used for the upper layer resist in a bi-layer resist method to allow oxygen-reactive ion etching ($O_2$-RIE) for etching of the lower layer resist, and most preferably etching with a mixed gas of oxygen and sulfur dioxide. The plasma etching apparatus used is preferably a high-density plasma etching apparatus.

The resist composition of the invention is suitable for formation of resist patterns that require high aspect ratios, and therefore even in cases, for example, where etching is difficult without the use of a hard mask, the etching can be carried out without using a hard mask, thus providing the convenience that no steps are necessary for formation of the hard mask.

The present invention will now be explained in further detail by way of the following examples which, however, are in no way intended to restrict the scope of the invention.

EXAMPLE 1

In a nitrogen-flushed four-necked flask equipped with a reflux tube and thermometer there were placed 6.9 g (0.023 mole) of 1,3-bis(carboxypropyl)tetramethyldisiloxane, 35 ml of purified water and 20.6 ml of acetic acid, and the mixture was stirred and heated to 60° C. in an oil bath. After the dropwise addition of 12.48 g (0.06 mole) of tetraethoxysilane to the mixture over 30 minutes, reaction was conducted for one hour. Next, 6.24 g (0.03 mole) of tetraethoxysilane was added dropwise to the mixture over 30 minutes, and reaction was conducted for 3 hours. After allowing it to cool to room temperature, the reaction solution was transferred to a separatory funnel, 100 ml of water and 100 ml of methyl isobutyl ketone (MIBK) were added to extract the solvent, and then the organic layer was filtered off with liquid layer separating filter paper, transferred to the four-necked flask and azeotropically drained to obtain an MIBK solution containing a tetrafunctional siloxane polymer.

Next, in a nitrogen-flushed four-necked flask equipped with a reflux tube and thermometer there were placed the aforementioned polymer MIBK solution and 0.8 ml of pyridine, and the mixture was heated to 68° C. in an oil bath. After dropwise addition of 2.68 g (0.011 mole) of chloromethylphenylethyl dimethylchlorosilane to the mixture, reaction was conducted for two hours. After allowing it to cool to room temperature, the precipitate was filtered, the solution was returned to a nitrogen-flushed four-necked flask equipped with a reflux tube and thermometer, 12.0 g (0.84 mole) of trimethylsilylimidazole was added dropwise thereto while stirring at room temperature, and reaction was conducted for 2 hours. After adding 18 ml of hydrochloric acid and filtering off the resulting precipitate, the solution was transferred to a separatory funnel and rinsed 6 times with water, and then the organic layer was filtered off with liquid layer separating filter paper and azeotropically drained. This solution was then concentrated and the component that precipitated with hexane was lyophilized with dioxane to obtain a silicon-containing polymer with a molecular weight of 6800 and a dispersion degree of 1.35, at a 68% yield. The Si content of the polymer was 35% as determined by NMR, and the values for the relationship in formula 1 based on the proportion of each functional group were:

$$\frac{l}{l+m+n} = 0.36 \qquad \frac{m}{l+m} = 0.06$$

The transmittance of the polymer was 92% at 248 nm and 62% at 193 nm (both in terms of 0.1 μm).

The MIBK solution of this polymer was spin coated onto a Si wafer and baked at 110° C. for 60 seconds to prepare a sample. Immersion in a 2.38% TMAH aqueous solution exhibited a dissolution rate of 0.4 μm/s, thus confirming that the silicon-containing polymer was alkali soluble.

Comparative Example 1

In a nitrogen-flushed four-necked flask equipped with a reflux tube and thermometer there were placed 9.2 g (0.02 mole) of 1,3-bis(carboxypropyl)tetramethyldisiloxane, 84 ml of purified water, 8.4 ml of concentrated hydrochloric acid and 320 ml of tetrahydrofuran (THF), and the mixture was heated to reflux in an oil bath. After dropwise addition of 12.5 g (0.06 mole) of tetraethoxysilane to the mixture over 30 minutes, reaction was conducted for one hour. The mixture was cooled to room temperature and the reaction solution was appropriately concentrated and then dissolved in an excess of MIBK. After transfer to a separatory funnel and rinsing with water until the aqueous layer became neutral, the organic layer was filtered off with liquid layer separating filter paper, transferred to the four-necked flask and azeotropically drained to obtain a polymer MIBK solution. This was concentrated to obtain a polymer that was then transferred to a nitrogen-flushed four-necked flask equipped with a reflux tube and thermometer, and after adding 3.48 g of purified water, 1.23 ml of concentrated sulfuric acid and 12.42 g of THF and stirring, the mixture was heated to reflux in an oil bath. After dropwise addition of 10.35 g (0.05 mole) of tetraethoxysilane to the mixture over 30 minutes, reaction was conducted for one hour. The mixture was cooled to room temperature and the reaction solution was appropriately concentrated and then dissolved in an excess of MIBK. After transfer to a separatory funnel and rinsing with water until the aqueous layer became neutral, the organic layer was filtered off with liquid layer separating filter paper, transferred to the four-necked flask and azeotropically drained to obtain a polymer MIBK solution. The solution was concentrated to obtain a polymer that was then transferred to a nitrogen-flushed four-necked flask equipped with a reflux tube and thermometer, and after adding 90.00 g of MIBK and 0.28 g of pyridine and stirring, the mixture was heated to 70° C. in an oil bath. After dropwise addition of 0.96 g (0.004 mole) of chloromethylphenylethyl dimethylchlorosilane to the mixture, reaction was conducted for two hours. After allowing to cool to room temperature, the solution was naturally filtered and the precipitate was removed. The solution was returned to the nitrogen-flushed four-necked flask equipped with a reflux tube and thermometer, 8.0 g (0.056 mole) of trimethylsilylimidazole was added dropwise thereto while stirring at room temperature, and reaction was conducted for 2 hours. After adding 12 ml of hydrochloric acid and naturally filtering the resulting precipitate, the solution was transferred to a separatory funnel and rinsed with water until the aqueous layer became neutral, and the organic layer was filtered off with liquid layer separating filter paper, transferred to the four-necked flask and azeotropically drained. This solution was then concentrated, and the high molecular weight component was separated with toluene and lyophilized with dioxane to obtain a silicon-containing polymer with a molecular weight of 8000 and a dispersion degree of 1.7 at a 40% yield. The Si content of the polymer was 35% as determined by NMR, and the values for the relationship in formula 1 based on the proportion of each functional group were:

$$\frac{l}{l+m+n} = 0.45 \qquad \frac{m}{l+m} = 0.32$$

The transmittance of the polymer was 80% at 248 nm and 42% at 193 nm (both in terms of 0.1 μm).

The MIBK solution of this polymer was spin coated onto a Si wafer and baked at 110° C. for 60 seconds to prepare a sample. Immersion in a 2.38% TMAH aqueous solution exhibited a very high dissolution rate, thus confirming that the silicon-containing polymer was alkali soluble.

EXAMPLE 2

A resist solution was prepared by dissolving the silicon-containing polymer of Example 1 in MIBK. Next, a novolac resin-based solution was first spin coated onto a Si wafer and baked for 30 minutes with a hot plate at 250° C. to form a 0.45 μm lower resist layer, and then a resist solution of the silicon-containing polymer of Example 1 prepared above was spin coated onto the lower layer resist and prebaked at 110° C. for 60 seconds to form a 0.1 μm upper resist layer. After exposing the upper layer with an ArF excimer laser, it was developed with a 2.38% TMAH aqueous solution. This resulted in resolution of a 0.17 μm line-and-space pattern at an exposure dose of 35 mJ/cm². Upon etching with a parallel plate RIE apparatus under conditions of 0.16 W/cm² RF power, 10 sccm oxygen flow rate and 10 mTorr gas pressure, the lower layer was successfully transferred without shape deterioration, thus allowing formation of a bi-layer resist pattern with an aspect ratio of about 3. Measurement of the etching rate of the upper layer resist made of the silicon-containing polymer, with respect to the lower layer resist, revealed a high O₂-RIE resistance of approximately 100-fold. Upon heating the pattern-formed substrate on a hot plate and determining the heat resistance of the resist pattern, absolutely no changes in the pattern shape were found even with heating at 300° C. and above.

EXAMPLE 3

A 0.45 μm lower resist layer was formed on a Si wafer in the same manner as Example 2, and then a resist solution comprising an MIBK solution of the silicon-containing polymer of Example 1 was spin coated thereon and prebaked at 110° C. for 60 seconds to form a 0.1 μm upper resist layer. After exposure of the upper layer with an ArF excimer laser using a Levenson phase contrast shift mask, it was developed with a 2.38% TMAH aqueous solution. This resulted in resolution of a 0.14 μm line-and-space pattern at an exposure dose of 35 mJ/cm². Upon etching with a parallel plate RIE apparatus under conditions of 0.16 W/cm² RF power, 10 sccm oxygen flow rate and 10 mTorr gas pressure, the lower layer was successfully transferred without shape deterioration, thus allowing formation of a bi-layer resist pattern with an aspect ratio of about 3.6.

EXAMPLE 4

A 0.45 μm lower resist layer was formed on a Si wafer in the same manner as Example 2, and then a resist solution comprising an MIBK solution of the silicon-containing polymer of Example 1 was spin coated thereon and prebaked at 110° C. for 60 seconds to form a 0.1 μm upper resist layer. After exposure of the upper layer with an electron beam, it was developed with a 2.38% TMAH aqueous solution. This resulted in resolution of a 0.1 μm line-and-space pattern at an exposure dose of 70 μC/cm². Upon etching with a parallel plate RIE apparatus under conditions of 0.16 W/cm² RF power, 10 sccm oxygen flow rate and 10 mTorr gas pressure, the lower layer was successfully transferred without shape deterioration, thus allowing formation of a bi-layer resist pattern with an aspect ratio of about 5.0.

Comparative Example 2

A resist solution was prepared by dissolving only the silicon-containing polymer of Comparative Example 1 in MIBK. Next, a novolac resin-based solution was spin coated onto a Si wafer and baked for 30 minutes with a hot plate at 250° C. to form a 0.45 μm lower resist layer. Next, the resist solution prepared above was spin coated onto the lower layer resist and prebaked at 110° C. for 60 seconds to form a 0.1 μm upper resist layer. After exposure of the upper layer with an ArF excimer laser, it was developed with a 2.38% TMAH aqueous solution. This resulted in separate resolution of no smaller than a 0.5 μm line-and-space pattern, while dissolution was to 0.4 μm and smaller. When a 0.0238% TMAH aqueous solution was used as the developing solution, a 0.2 μm line-and-space pattern was resolved.

EXAMPLE 5

A polymer was synthesized in the same manner as Example 1, except that the charging amount of the 1,3-bis (carboxypropyl)tetramethyldisiloxane was changed. As a result there were obtained polymers with weight average molecular weights of 13,000 and 3000. The values for the relationship between the numbers in formula 1 for the polymers as determined by NMR, were $$\frac{l}{l+m+n} = 0.18 \qquad \frac{m}{l+m} = 0.05$$

for the 13,000 molecular weight polymer and $$\frac{l}{l+m+n} = 0.36 \qquad \frac{m}{l+m} = 0.05$$

for the 3000 molecular weight polymer, and both were within the ranges for the specific proportions.

EXAMPLE 6

The 3000 molecular weight silicon-containing polymer obtained in Example 5 was used alone as an upper layer resist polymer, and it was evaluated as a resist material in the same manner as Example 2. After exposure of the upper layer with an ArF excimer laser, it was developed with a 2.38% TMAH aqueous solution. This resulted in resolution of a 0.17 μm line-and-space pattern at an exposure dose of 45 mJ/cm². Upon etching with a parallel plate RIE apparatus under conditions of 0.16 W/cm² RF power, 10 sccm oxygen flow rate and 10 mTorr gas pressure, the lower layer was successfully transferred without shape deterioration, thus allowing formation of a bi-layer resist pattern with an aspect ratio of about 3. Measurement of the etching rate of the upper layer resist made of the silicon-containing polymer, with respect to the lower layer resist, revealed a high O₂-RIE resistance of approximately 100-fold. Upon heating the pattern-formed substrate on a hot plate and determining the heat resistance of the resist pattern, absolutely no changes in the pattern shape were found even with heating to 300° C. and above.

EXAMPLE 7

A mixture of two silicon-containing polymers with different molecular weights obtained according to Example 5 was used as an upper layer resist polymer (13,000 molecular weight polymer:3000 molecular weight polymer=5:95 (wt ratio)), and it was evaluated as a resist material in the same manner as Example 2. After exposure of the upper layer with an ArF excimer laser, it was developed with a 2.38% TMAH aqueous solution. This resulted in resolution of a 0.15 μm line-and-space pattern at an exposure dose of 25 mJ/cm². Upon etching with a parallel plate RIE apparatus under conditions of 0.16 W/cm² RF power, 10 sccm oxygen flow rate and 10 mTorr gas pressure, the lower layer was successfully transferred without shape deterioration, thus allowing formation of a bi-layer resist pattern with an aspect ratio of about 3.3. Measurement of the etching rate of the upper layer resist made of the silicon-containing polymer, with respect to the lower layer resist, revealed a high O₂-RIE resistance of approximately 100-fold. Upon heating the pattern-formed substrate on a hot plate and determining the heat resistance of the resist pattern, absolutely no changes in the pattern shape were found even with heating to 300° C. and above.

EXAMPLE 8

In a reflux tube-equipped Erlenmeyer flask there were placed 3.0 g of the silicon-containing polymer with a molecular weight of 6800 and a dispersion degree of 1.35 obtained in Example 1, 30 ml of dioxane and a catalytic amount of p-toluenesulfonic acid, and the mixture was stirred and heated to 60° C. in an oil bath. After the dropwise addition of 12.48 g (0.06 mole) of dihydropyrane to the mixture, reaction was conducted while observing the esterification rate by IR. The reaction solution was then purified by dropwise addition to a water/methanol mixture and reprecipitation. The polymer was transferred to the reflux tube-equipped Erlenmeyer flask as a mixed solution with 25 ml of MIBK and 5 ml of methanol and stirred, and then 6 ml of a 10 wt % hexane solution of trimethylsilyldiazomethane was added dropwise and reaction was conducted at room temperature for one hour. Ether was then added to the reaction solution, and this mixture was transferred to a separatory funnel, rinsed 6 times with water, dewatered by addition of magnesium sulfate to the ether layer, and then filtered to obtain the target polymer solution. This was then concentrated and lyophilized with dioxane to obtain a silicon-containing polymer with a molecular weight of 6000 and a dispersion degree of 1.4. The Si content of the polymer was 34% as determined by NMR, and the values for the relationship in formula 3 based on the proportion of each functional group were:

$$\frac{l}{l+n+p+q} = 0.03 \qquad \frac{q}{l+n+p+q} = 0.52$$

The transmittance of the polymer was 76% at 248 nm and 54% at 193 nm (both in terms of 0.1 μm).

The MIBK solution of this polymer was spin coated onto a Si wafer and baked at 110° C. for 60 seconds to prepare a sample. Immersion in a 2.38% TMAH aqueous solution exhibited no dissolution of the polymer, thus confirming that the silicon-containing polymer was alkali insoluble.

EXAMPLE 9

A 0.45 μm lower resist layer was formed on a Si wafer in the same manner as Example 2, and then a resist solution, comprising an MIBK solution prepared by dissolving the silicon-containing polymer of Example 8 and triphenylsulfonium triflate in an amount of 5 parts by weight to 100 parts by weight of the silicon-containing polymer in MIBK, was spin coated thereon and prebaked at 110° C. for 60 seconds to form a 0.1 μm upper resist layer. After exposure of the upper layer with an ArF excimer laser, it was developed with a 2.38% TMAH aqueous solution. This resulted in resolution of a 0.14 μm hole pattern at an exposure dose of 10 mJ/cm². Upon etching with a parallel plate RIE apparatus under the same conditions as Example 3, the lower layer was successfully transferred without shape deterioration, thus allowing formation of a bi-layer resist pattern with an aspect ratio of about 4.5. The etching rate of the upper layer resist made of the silicon-containing polymer, with respect to the lower layer resist, was approximately 90-fold. Upon heating the pattern-formed substrate on a hot plate and determining the heat resistance of the resist pattern, absolutely no changes in the pattern shape were found even with heating to 300° C. and above.

EXAMPLE 10

A 0.15 μm line-and-space resist pattern was formed on a substrate laminated with films of chromium oxide, pure chromium and chromium oxide in that order, according to the method described in Example 3. The obtained resist pattern was used as a mask for etching of the underlying chromium using reactive gas containing a halogenated hydrocarbon added to oxygen, and then the two-layer resist was released to produce a reticle.

A quartz substrate laminated with a chromium oxide film and MeSiON film was used as a half-tone material in place of the chromium oxide/pure chromium/chromium oxide film for patterning in the same manner, to manufacture a half-tone reticle.

EXAMPLE 11

Figure 2:
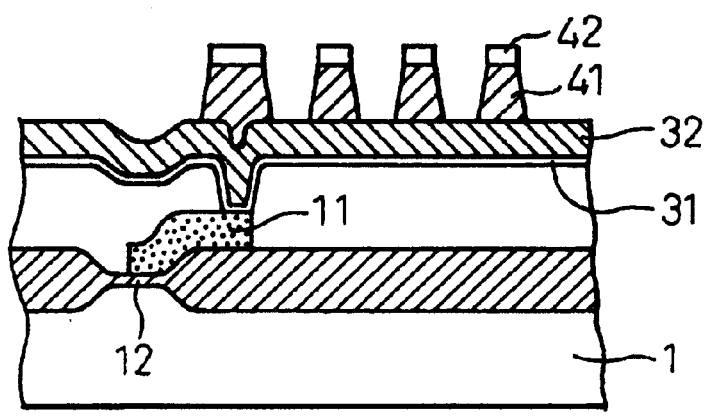
Figure 3:
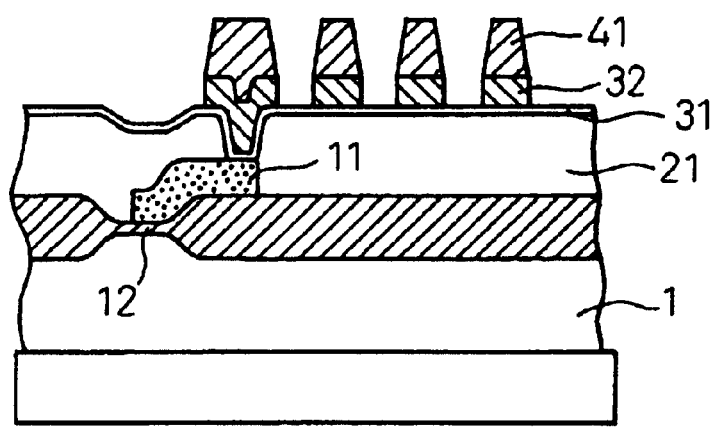

A MOS transistor 10 with elements isolated by field oxidation was formed on a silicon substrate 1. A dielectric layer 21 was accumulated on the gate electrode 11 of the MOS transistors and an opening for feeding a wire to the gate electrode 11 was formed by lithographic means. A thin film 31 was then formed of titanium nitride (TiN) used as a barrier metal, and a thin film 32 of Al was accumulated thereover as a wiring material (FIG. 1). For working of the Al/TiN film into a wiring pattern, a resist pattern 42 acting as an etching mask was formed on the Al/TiN accumulated layer film by the means described in Example 2. The resist pattern was used as an etching mask for transfer to the lower layer by oxygen plasma etching (FIG. 2). The resist pattern 42 was removed by fluorine-based plasma etching, to complete an etching mask 41 comprising the lower layer resist. The etching mask 41 was used for etching of the Al/TiN accumulated layer film to be etched, by chlorine-based plasma, giving a gate wiring pattern with a high aspect ratio (FIG. 3).

EXAMPLE 12

After forming a lower shield, lower gap, lead element, terminal, upper gap, upper shield, coil, insulating film and plating base on an AlTiC substrate by publicly known methods, a 0.25 μm resist pattern was formed thereover by the method described in Example 7. The obtained resist pattern was then used as a mask for etching of the underlayer, after which an upper magnetic material was formed as a film thereover by a plating method, and the resist was released to form an upper electrode.

As the above explanation demonstrates, the silicon-containing polymer of the invention, having carboxylic acid groups and functional groups in a specific proportion, is simple to produce, exhibits an excellent shelf-life, and is suitable as a resist material that can be easily developed with common alkali developing solutions, and which simultaneously provides high sensitivity, high resolution, high $O_2$-RIE resistance and high heat resistance; resist compositions of the invention comprising such a silicon-containing polymer are expected to make a major contribution to the more intricate and multilayered wirings that will accompany ever higher integration and higher functionality of electronic devices such as semiconductor devices.

What is claimed is:

1. A silicon-containing polymer comprising the structure represented by formula 1 below as a main structural unit

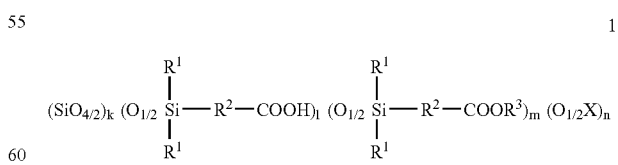

where $R^1$ represents a monovalent organic group, $R^2$ represents a direct bond or a divalent organic group, $R^3$ represents a monovalent organic group or an organosilyl group, any of which groups may be of different types, X represents hydrogen, a monovalent organic group or an organosilyl group, which groups may be of different types, k and l are positive integers, m is 0 or a positive integer and n is a positive integer, and these subscripts satisfy the following relationship $$0 < \frac{l}{l+m+n} \leq 0.8 \qquad 0 \leq \frac{m}{l+m} < 0.2$$

wherein at least some of the X groups are triorganosilyl groups.

2. A silicon-containing polymer according to claim 1, wherein said triorganosilyl groups include photosensitive crosslinkable groups.

3. A silicon-containing polymer represented by formula 2 below,

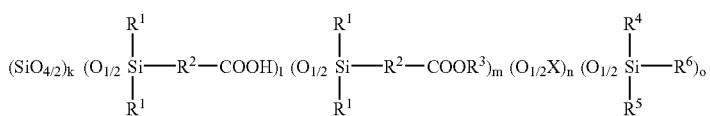

2 where $R^1$ represents a monovalent organic group,
$R^2$ represents a direct bond or a divalent organic group,
$R^3$ represents a monovalent organic group or an organosilyl group, any of which groups may be of different types,
X represents hydrogen, a monovalent organic group or an organosilyl group, which groups may be of different types, wherein at least some of the X groups are triorganosilyl groups containing a photosensitive crosslinkable group and wherein the photosensitive crosslinkable group is chloromethylphenylethyl,
$R^4$, $R^5$ and $R^6$ each independently represent a monovalent organic group, at least one of $R^4$, $R^5$ and $R^6$ being a monovalent organic group containing chloromethylphenylethyl, wherein $R^4$, $R^5$ and $R^6$ may be one or more different types of organic groups,
k, l and o are positive integers,
m and n are 0 or positive integers, and
these subscripts satisfy the following relationships:

$$0 < \frac{o}{l+m+n+o} \leq 0.8$$

$$0 < \frac{l}{l+m+n} \leq 0.8 \qquad 0 \leq \frac{m}{l+m} < 0.2.$$

4. A silicon-containing polymer comprising the structure represented by formula 3 below as a main structural unit

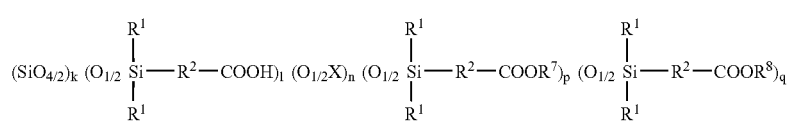

3 where $R^1$ represents a monovalent organic group, $R^2$ represents a direct bond or a divalent organic group, $R^7$ and $R^8$ each independently represent a monovalent organic group or an organosilyl group, any of which groups may be of different types, X represents hydrogen, a monovalent organic group or an organosilyl group, which groups may be of different types, k and q are positive integers, l, n, and p are 0 or positive integers, and these subscripts satisfy the following relationship:

$$0 \leq \frac{l}{l+n+p+q} < 0.5 \qquad 0.1 < \frac{q}{l+n+p+q} \leq 0.8.$$

wherein $R^8$ is a functional group that is eliminated by an acid catalyst.

5. A silicon-containing polymer according to claim 4, wherein at least some of the X groups are triorganosilyl groups.

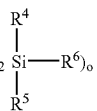

6. A silicon-containing polymer according to any one of claims 1 to 5, where $R^2$ is —$(CH_2)_a$— and a is an integer of 1–10.

7. A silicon-containing polymer comprising the structure represented by formula 1 below as a main structural unit

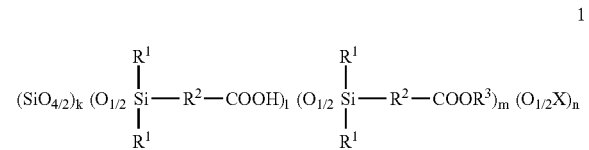

1 where $R^1$ represents a monovalent organic group, $R^2$ represents a direct bond or a divalent organic group, $R^3$ represents a monovalent organic group or an organosilyl group, any of which groups may be of different types, X represents hydrogen, a monovalent organic group or an organosilyl group, which groups may be of different types, k and l are positive integers, m is a positive integer, and n is 0 or a positive integer, and these subscripts satisfy the following relationship: $0<l/(l+m+n) \leq 0.8$ and $0<m/(l+m) <0.2$.

8. A silicon-containing polymer according to claim 7, wherein at least some of the X groups are triorganosilyl groups.

9. A silicon-containing polymer according to claim 8, wherein said triorganosilyl groups include photosensitive crosslinkable groups.

10. A silicon-containing polymer according to any one of claims 7 to 9, where $R^2$ is —$(CH_2)_a$— and a is an integer of 1–10.

* * * * *